United States Patent [19]

Sarkar

[11] 4,233,045
[45] Nov. 11, 1980

[54] APPARATUS AND METHOD FOR MAKING OPTICAL FILAMENT PREFORM

[75] Inventor: Arnab Sarkar, Big Flats, N.Y.

[73] Assignee: Corning Glass Works, Corning, N.Y.

[21] Appl. No.: 963,837

[22] Filed: Nov. 27, 1978

[51] Int. Cl.³ .................................................. C03C 7/02
[52] U.S. Cl. ......................................... 65/3 A; 65/12;
65/60 D; 350/96.30; 350/96.31
[58] Field of Search .................... 65/2, 3 A, 11 R, 12,
65/13, 60; 350/96.30, 96.34

[56] References Cited

U.S. PATENT DOCUMENTS

| | | | |
|---|---|---|---|
| 4,117,802 | 10/1978 | Le Sergeant et al. | 65/3 A X |
| 4,155,733 | 5/1979 | Sandbank | 65/3 A |
| 4,162,908 | 7/1979 | Rau et al. | 65/60 D |

FOREIGN PATENT DOCUMENTS

| | | | |
|---|---|---|---|
| 2266668 | 10/1975 | France | 65/3 A |
| 51-71313 | 6/1976 | Japan | 65/3 A |

*Primary Examiner*—Robert L. Lindsay, Jr.
*Attorney, Agent, or Firm*—William J. Simmons, Jr.; Walter S. Zebrowski

[57] ABSTRACT

A glass optical waveguide filament preform is prepared by chemical reaction of vapor ingredients within a glass bait tube. A reactant feed tube extends into one end of the bait tube and terminates just short of the hot zone where reaction occurs. The end of the feed tube traverses the bait tube along with the burner which generates the hot zone. Reactants flow radially from slots in the end of the wall of the feed tube and combine with a flushing gas to form a mixture which flows in a spiral path through the hot zone.

17 Claims, 7 Drawing Figures

APPARATUS AND METHOD FOR MAKING OPTICAL FILAMENT PREFORM

BACKGROUND OF THE INVENTION

The present invention relates to optical waveguide filaments, and more particularly to an improved method of forming blanks from which such filaments are drawn.

Optical waveguides, which are the most promising medium for use in optical communication systems operating in the visible or near visible spectra, normally consist of an optical filament having a transparent core surrounded by a transparent cladding material having a refractive index lower than that of the core.

The stringent optical requirements placed on the transmission medium to be employed in optical communications systems has negated the use of conventional glass fiber optics, since attenuation therein due to both scattering and impurity absorption is much too high. Thus, unique methods had to be developed for preparing very high purity glasses in filamentary form. Certain glass making processes, particularly vapor deposition processes, have been commonly employed in the formation of optical waveguide blanks. In one such process, the source material vapour is directed into a heated tube wherein it reacts to form a material which is deposited in successive layers. The combination of deposited glass and tube is collapsed to form a draw blank which can be later heated and drawn into an optical waveguide filament.

In order to obtain uniform deposition along the length of the substrate tube, a serial deposition process has been employed. That is, reactants are fed into the end of the tube, but deposition occurs only in a section of the tube downstream of the region which is heated by a flame. The flame moves up and down the tube to move the reaction and thus the region of glass deposition serially along the tube.

One of the limitations of such a process is a comparatively low effective mass deposition rate. To increase the deposition rate it appears to be necessary to increase the inside diameter of the substrate tube to provide a greater collection surface area. However, since heat is supplied from the outside of the tube, a larger tube diameter results in a lower vapor temperature at the axis of the tube. Moreover, the flow profile across the tube is such that maximum flow occurs axially within the tube. As tube diameter increases, a smaller portion of the reactant vapor flows in that region of the tube adjacent the wall where reaction temperature is higher and where the resultant sooty reaction products are more readily collected downstream of the heated region of the tube.

It is therefore an object of the present invention to improve the deposition efficiency of a process whereby a reactant vapor flows into and reacts within a heated tube to form a layer therein.

SUMMARY OF THE INVENTION

Briefly, the present invention relates to a method and apparatus for manufacturing a preform which is intended to be subsequently drawn into an optical filament. This method is of the type that includes the steps of flowing a vapor mixture including at least one compound, glass-forming precursor, together with an oxidizing medium, into a hollow, cylindrical bait tube, and heating the bait tube and contained vapor mixture with a heat source that moves relative to the bait tube in a longitudinal direction, whereby a moving hot zone is established within the bait tube, such that a suspension of particulate, oxidic reaction product material is produced within the hot zone, at least a portion thereof coming to rest on the inner surface of the bait tube where it is fused to form a continuous glassy deposit. The improvement of the present invention comprises imparting a radial velocity component to the flow of the vapor mixture in the hot zone so that the resultant particulate matter, as formed, has a radial velocity component. The combination of this initial radial velocity component with that due to thermophoresis increases the probability that particulate matter will impinge upon the deposition region of the bait tube.

In accordance with a preferred embodiment of the present invention, a feed tube for conducting the reactant vapor is disposed in one end of the cylindrical bait tube, one end of the feed tube terminating adjacent the hot zone. Means is provided for moving the feed tube longitudinally with respect to the bait tube in synchronism with the movement of the heating means which generates the moving hot zone. Reactant vapor flows from at least one orifice disposed in the wall of the feed tube near the end thereof.

DESCRIPTION OF THE PREFERRED EMBODIMENT

Figure 1:
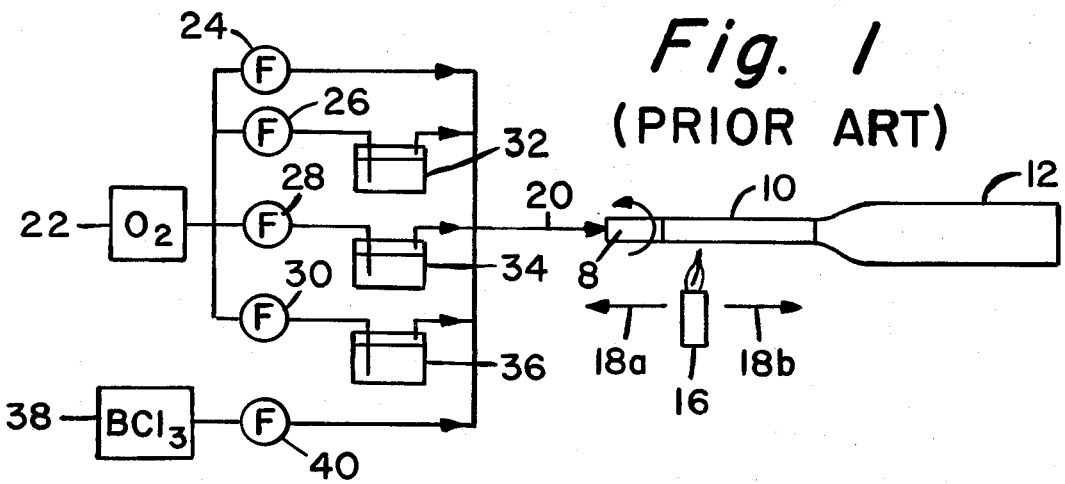
FIG. 1 is a schematic representation of a prior art apparatus for depositing a glass layer within a tube.
Figure 2:
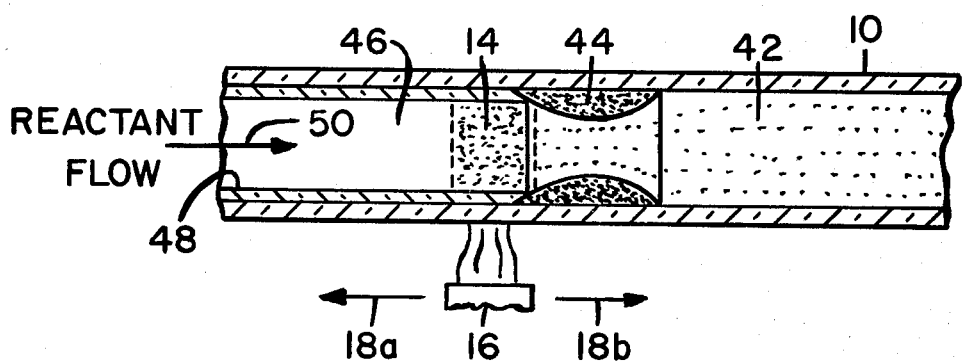
FIG. 2 shows a section of the tube of FIG. 1 depicting observed conditions during processing.

FIGS. 1 and 2 show a prior art system comprising a substrate or bait tube 10 having handle tube 8 affixed to the upstream end thereof and exhaust tube 12 affixed to the downstream end thereof. Tubes 8 and 12 are chucked in a conventional glass turning lathe (not shown), and the combination is rotated as indicated by the arrow. The handle tube 8, which may be omitted, is an inexpensive glass tube having the same diameter as the substrate tube, and it does not form a part of the resultant optical waveguide. A hot zone 14 is caused to traverse tube 10 by moving heating means 16 as schematically depicted by arrows 18a and 18b. Heating means 16 can consist of any suitable source of heat such as a plurality of burners encircling tube 10. Since tube 10 is rotated, the temperature around the circumference is substantially uniform. Reactants are introduced into tube 10 via inlet tube 20, which is connected to a plurality of sources of gases and vapors. In FIG. 1, flow meters are represented by a circle having the letter "F" therein. A source 22 of oxygen is connected by flow meter 24 to inlet tube 20 and by flow meters 26, 28 and 30 to reservoirs 32, 34 and 36, respectively. A source 38 of boron trifluoride is connected to tube 20 by a flow meter 40. Reservoirs 32, 34 and 36 contain normally liquid reactant materials which are introduced into tube 10 by bubbling oxygen or other suitable carrier gas therethrough. Exiting material is exhausted through exhaust tube 12. Not shown is an arrangement of mixing valves and shutoff valves which may be utilized to meter flows and to make other necessary adjustments in composition.

Figure 3:
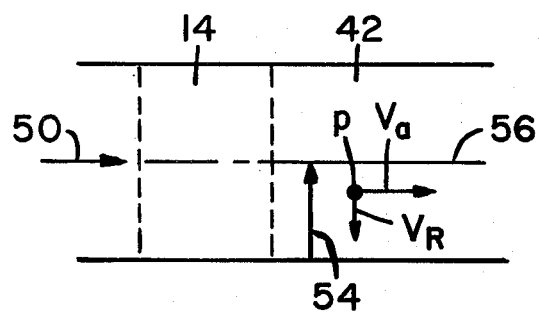
FIG. 3 is a schematic diagram illustrating the velocity components of a particular flowing in the deposition region of a substrate tube.

Burner 16 initially moves at a low rate of speed relative to tube 10 in the direction of arrow 18b, the same direction as the reactant flow. The reactants react in hot zone 14 to produce a powdery suspension of particulate oxidic material, often referred to as soot, which is carried downstream to region 42 of tube 10 by moving gas. That portion of region 42, which is adjacent hot zone 14, has a sufficiently high temperature to cause impinging soot particles to adhere thereto. Thus, a soot buildup 44 occurs in that portion of region 42. Because of the relatively high soot deposition efficiencies which have been observed, it has been evident that soot particles produced in region 14 remote from the tube walls are subjected to a force which imparts a radical velocity component to the particles. This phenomenon can be explained by referring to the diagram of FIG. 3. When reactants 50 flow into hot zone 14, soot particles are formed, one of which is shown as particle p. In hot zone 14 particle p and the gaseous products of reaction become heated. Thus, in region 42, wherein the temperature of the wall portion of tube 10 is lower than that of the flowing particles and gases, a temperature gradient exists between the wall and the tube axis 56 as indicated by arrow 54. Particle p has an axial velocity component $V_a$ due to the reactant flow which has the tendency to cause the particle to move through region 42 and into exhaust tube 12. However, the rate of soot deposition in region 42 is sufficiently high as to imply the existence of a force which imparts a velocity component $V_R$ to particle p which drives it toward the wall of tube 10. Of the various possible contributors to radial velocity component $V_R$, it appears that the thermophoresis component $V_t$ resulting from temperature gradient 54 has the greatest effect.

It is noted that essentially no soot is formed in region 46 of tube 10 upstream from hot zone 14. As burner 16 continues to move in the direction of arrow 18b, hot zone 14 moves downstream so that a part of soot buildup 44 extends into the hot zone and is consolidated thereby to form a unitary, homogeneous glassy layer 48. Such process parameters as temperatures, flow rates, reactants and the like are discussed in the publications J. B. MacChesney et al., Proceedings of the IEEE, 1280 (1974) and W. G. French et al., Applied Optics, 15 (1976). Reference is also made to the text *Vapor Deposition*, Edited by C. F. Powell et al., John Wiley and Sons, Inc. (1966).

When burner 16 reaches the end of tube 10 adjacent to exhaust tube 12, the temperature of the flame is reduced and the burner returns in the direction of arrow 18a to the input end of tube 10. Thereafter, additional layers of glassy material are deposited within the tube 10 in the manner described above. After suitable layers have been deposited to serve as the cladding and/or core material of the resultant optical waveguide filament, the temperature of the glass is increased to about 2200° C. for high silica content glass to cause tube 10 to collapse. This can be accomplished by reducing the rate of traverse of the hot zone. The resultant draw blank is then drawn in accordance with well-known techniques to form an optical waveguide filament having the desired diameter. Alternatively, the uncollapsed blank may be subsequently reheated and the hole collapsed, or the hole may be collapsed during the drawing process.

To optimize the process from the standpoint of reaction, high temperatures are utilized in the deposition process. For the usual silica based system, temperatures at the substrate wall as generally maintained between about 1400° and 1900° C. at the moving position corresponding with the hot zone. Indicated temperatures are those measured by a radiation pyrometer focused at the outer tube surface.

It is commonly known that one of the factors which limits deposition rate is the rate of sintering deposited soot to form a transparent glass layer. For a given composition of glass to be deposited, there is a maximum layer thickness of glass that can be sintered using the optimal combination of hot zone width, peak temperature of the hot zone and burner traverse rate. If the thickness of the sintered glass layer can be kept to the maximum value for different tube diameters, deposition rate increases proportionately with tube inside diameter because of increased surface area. However, because of the nature of flow dynamics of the reactants vapor stream and soot particle dynamics, the percentage of soot produced which deposits in the substrate tube decreases with increased tube diameter, thereby causing an effective decrease of deposition rate.

Figure 4:
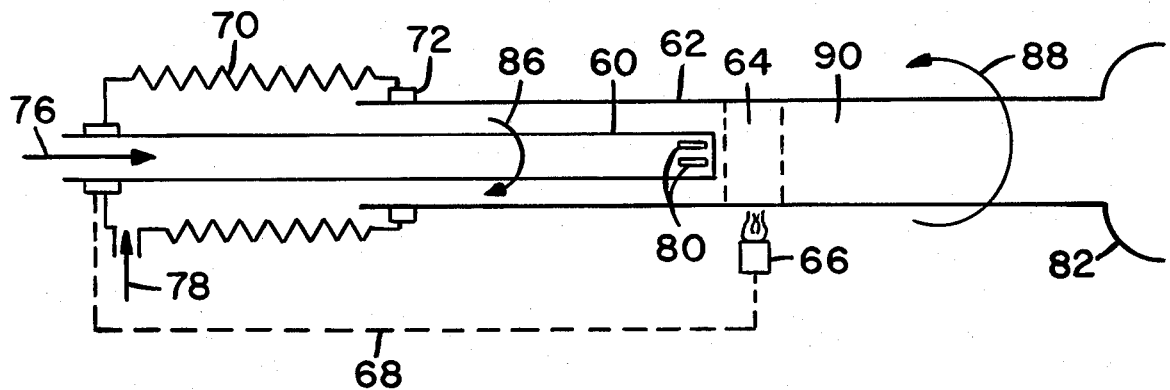
FIG. 4 is a schematic representation of an apparatus constructed in accordance with the present invention.

In accordance with the present invention means is provided for imparting to the soot particles a radial velocity component $V_r$ in addition to that caused by thermophoresis. In addition, the residence time of the soot particles in the deposition region of the tube is increased. A preferred apparatus for performing this function is shown in FIG. 4 wherein a portion of a reactant feed tube 60 extends into an end of substrate or bait tube 62 and terminates just prior to hot zone 64. The temperature of zone 64 may be in the same range as that described in conjunction with the prior art apparatus of FIGS. 1 and 2. Tube 60 is mechanically coupled by means represented by dashed line 68 to burner 66 to ensure that tube 60 is maintained the proper distance upstream of the hot zone 64 as heat source 66 traverses tube 62. Alternatively, the heat source and gas feed tube may be kept stationary, and the rotating substrate tube may be traversed. The input end of tube 62 is connected to tube 60 by a collapsible member 70, a rotating seal 72 being disposed between member 70 and tube 62.

The reactants flow into tube 60 as indicated by arrow 76, and emanate from one or more orifices 80 located around the circumference of the end portion of tube 60. A flushing gas flows into the end of tube 62 as indicated by arrow 78 to impart an axial velocity to the reactants emanating from orifices 80, thereby ensuring the flow of reactants into hot zone 64. The flushing gas also causes the products of reaction to flow from hot zone 64 toward exhaust tube 82, thereby resulting in the aforementioned thermophoresis effect. The flushing gas can be any gas that does not adversely affect the reaction occurring in hot zone 64 and could consist of such gases as oxygen, helium or mixtures thereof and could also contain reactant gases such as $SiCl_4$, $GeCl_4$ and the like.

Figure 5:
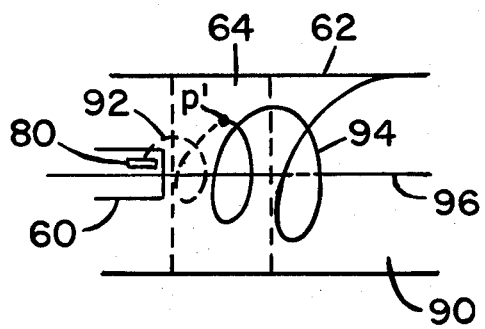
FIGS. 5 and 6 are schematic diagrams illustrating the operation of the embodiment of FIG. 4.
Figure 6:
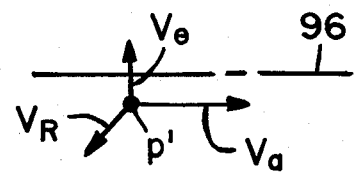

The operation of the embodiment of FIG. 4 is schematically illustrated in FIGS. 5 and 6. The reactants flow radially outwardly from orifices 80 with a radial flow velocity component. As illustrated by arrows 86 and 88, tubes 60 and 62 preferably rotate in opposite directions to impart an angular velocity component to the reactants flowing from orifices 80 relative to tube 62. Obviously, the angular velocity component could be generated by rotating only one of the tubes 60 and 62. The axial flow of flushing gas combines with the reactants and imparts an axial component thereto. Thus, as shown by dashed line 92 in the diagram of FIG. 5, the reactants flow from orifices 80 in a spiral pattern about axis 96. At some point in hot zone 64, particle p' is illustrated as being formed. Because of the spiral flow pattern existing in hot zone 64 and in region 90 downstream therefrom, particle p' possesses an axial velocity component $V'_a$ and an angular velocity component $V'_\theta$. Particle p' also possesses a radial velocity component $V'_r$ due to the radial component of flow of reactants from orifices 80. As particle p' flows downstream, it is also subjected to the thermophoresis force described in conjunction with FIG. 3. Thus, as shown in FIG. 6, particle p' has a radial velocity component $V'_R$ in region 90 which comprises components $V'_r$ and $V'_t$. The combination of these effects causes particle p' to traverse the spiral path represented by solid line 94. Since this apparatus provides particle p' with a radial velocity component at the time that it is formed, the probability that such a particle will respond to the thermophoresis effect and deposit on wall 62 in region 90 is increased in comparison with the above-described prior art.

Feed tube 60 should terminate prior to hot zone 64 to prevent the deposition of soot particles thereon. Such soot deposition would result in a buildup which could block the flow of reactants from orifices 80. However, orifices 80 should be relatively close to hot zone 64 to ensure that the reactant flow has a radial component at the time that particle p' is formed. The radial flow component dissipates with increased axial distance from orifices 80. For this reason the axial length of orifices are preferably no longer than about 2 cm.

Figure 7:
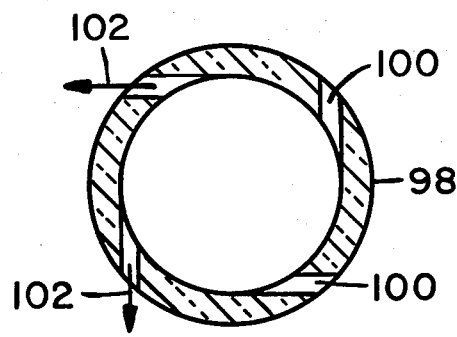
FIG. 7 is a cross-sectional view of the end portion of a feed tube.

The cross-sectional shape of orifices 80 may be circular, square, rectangular or the like. Moreover, the orifices can extend radially from the feed tube, or they may extend non-radially as illustrated in FIG. 7. In this figure orifices 100 extend tangentially from the inner surface of feed tube 98, thus imparting an angular velocity component to the reactants 102 issuing therefrom. In this embodiment the non-radial emergence of reactants from orifices 96 is at least partially responsible for the generation of a spiral flow of reactants through the hot zone. The angular velocity of the emerging reactant vapor with respect to the bait tube can be controlled by adjusting the rotational direction and speed of the feed tube with respect to the bait tube.

In the prior art deposition process described in conjunction with FIGS. 1 and 2, deposition efficiency falls with an increase in tube diameter. In accordance with that process an increase in deposition rate with increased tube diameter can be obtained by increasing tube diameter to about 30 mm. For tubes having diameters greater than about 30 mm, deposition efficiency falls at a faster rate so that further increase in deposition rate is difficult to obtain. However, with the use of feed tube 60, the reactant vapor stream is directed toward the wall of tube 62 so that the probability that soot particles will deposit thereon is increased as described in conjunction with FIGS. 5 and 6. Thus, a relatively high deposition efficiency can be maintained irrespective of bait tube diameter. The diameters of bait tubes employed in the present apparatus can therefore be larger than those employed in the prior apparatus of FIG. 1. The maximum size of the bait tube is, however, limited by such considerations as that size tube for which the inner hole can be closed to form an optical waveguide preform. The wall thicknesses of the bait tube and the baffle tube are usually maintained relatively small, i.e., a few millimeters in thickness.

After the desired thickness of deposited glass has been built up on the inner surface of bait tube 62, feed tube 60 is removed therefrom, and tube 62 is collapsed and drawn into a filament. Collapsible member 70 can be sufficiently large to permit complete withdrawal of tube 60 so that tube 62 can be collapsed on the lathe.

To illustrate the improvement in deposition rate and efficiency, a deposition system was operated both with and without a feed tube 60 therein. Apparatus similar to that shown in FIG. 1 was employed to supply the reactant streams, all bubblers being maintained at 35° C. for both examples. In each case the bait tube was a borosilicate glass tube having an outer diameter of 38 mm and a 1.8 mm wall thickness, and the burner traverse rate was 20 cm/min. The deposition temperature was 1850° C. in both examples.

In the example employing the apparatus of the present invention the feed tube had a 21 mm outside diameter and a 1 mm wall thickness and was formed of fused silica. The end of the feed tube was provided with eight radial slots around the circumference thereof, each slot being 2 mm wide and 5 mm long. The end of the feed tube was located 7.5 cm from a plane passing through the center of burner 66 and perpendicular to the tube axis.

Oxygen was bubbled through reservoirs 32, 34 and 36 which contained $SiCl_4$, $GeCl_4$ and $POCl_3$, respectively, at rates of 0.852 slm, 4.02 slm and 1.421 slm, respectively. The flow rates of $SiCl_4$, $GeCl_4$ and $POCl_3$ through feed tube 60 were 4.6 g/m, 2.0 g/m and 0.385 g/m, respectively, and the total oxygen flow through a feed tube 60 was about 6.3 slm. The rate of flow of oxygen through the annular region between tubes 60 and 62 was about 0.5 slm. The rate of deposition of soot on the wall of tube 62 was 0.57 g/m. From the flow rates of $SiCl_4$, $GeCl_4$ and $POCl_3$, the rate of oxide production was calculated to be 1.62 g/m $SiO_2$, 0.97 g/m $GeO_2$ and 0.18 g/m $P_2O_5$. Since the actual deposition rate was 0.57 g/m, the deposition efficiency was 21% when feed tube 60 was employed.

The system was also utilized to deposit a glass layer within a second bait tube, but no feed tube was employed. In this example oxygen was bubbled through reservoirs 32, 34 and 36 at rates of 0.83 slm, 3.62 slm and 1.07 slm, respectively. In addition, by-pass oxygen flowed through meter 24 at a rate of 3.0 slm, the total oxygen flow through the bait tube being 8.5 slm. The flow rates of $SiCl_4$, $GeCl_4$ and $POCl_3$ were 4.5 g/m, 1.8 g/m and 0.29 g/m, respectively. In this example the flow rate of $SiCl_4$ was maintained constant throughout the deposition process while the flow rates of $GeCl_4$ and $POCl_3$ were varied from a lower rate to a higher rate to provide a glass layer having a graded dopant concentration and therefore a graded refractive index. The specified flow rates for $GeCl_4$ and $POCl_3$ are therefore average rates over the entire deposition process. In this example, which was performed with prior art apparatus, the deposition rate was 0.36 g/m. Since the calculated rates of oxide production are 1.59 g/m $SiO_2$, 0.88 g/m $GeO_2$ and 0.13 g/m $P_2O_5$, the deposition efficiency was determined to be 14%.

In view of the improved results described hereinabove, it is believed that the method of the present invention can be employed to manufacture optical waveguides more efficiently than the prior art method described in conjunction with FIGS. 1 and 2. The mathematically calculated and estimated process parameters for forming a graded index optical waveguide are as follows. A tube of commercial grade fused silica glass having a 38 mm outside diameter and a 1.8 mm wall thickness is cleaned by sequential immersion in hydrofluoric acid, deionized water and alcohol. This bait tube, which is about 120 cm long, is attached to a 90 cm length of exhaust tube having a 65 mm outside diameter on one end and a 60 cm handle tube of the same size as the bait tube on the other end. This combination is inserted into a lathe such that the tubes are rotatably supported. The free end of the handle tube is provided with a rotatable seal through which a 180 cm long section of fused silica feed tube having a 21 mm outside diameter and a 1.0 mm wall thickness is inserted. The feed tube is supported at two different points along its length on a support which moves along with the burner. The end of the feed tube is provided with eight radial slots around the circumference thereof, each slot being 2 mm wide and 5 mm long. The end of the feed tube is located 7.5 cm from a plane passing through the center of the burner and perpendicular to the tube axis. The burner traverses a 100 cm length of the bait tube at a rate of 20 cm/min. The burner is adjusted to provide a deposition temperature of 1850° C. at the outer surface of the bait tube. After the burner reaches the end of its traverse during which a layer of glass is deposited, it returns to its starting point at a rate of 100 cm/min.

Oxygen flows into the region between the bait and feed tubes at the rate of 0.5 slm during the entire deposition process. Three reservoirs, which are maintained at 35° C., contain $SiCl_4$, $GeCl_4$ and $POCl_3$, respectively.

A barrier layer of $B_2O_3$-doped $SiO_2$ is initially deposited on the inner surface of the bait tube. This is accomplished by bubbling oxygen at a rate of 0.85 slm through the $SiCl_4$ reservoir where $SiCl_4$ is picked up at a rate of 4.5 g/m. This mixture of oxygen and $SiCl_4$ is combined with 60 sccm $BCl_3$, and the resultant mixture flows into the feed tube and out of the slots in the end thereof. The burner makes three passes along the tube to deposit the barrier layer.

This is followed by the deposition of the core glass layer. Oxygen flows through the reservoirs containing $SiCl_4$, $POCl_3$ and $GeCl_4$ at the rates set forth in Table I.

TABLE I

| Reactant | Carrier Oxygen (slm) | Reactant Flow Rate (g/m) |
| --- | --- | --- |
| $SiCl_4$ | 0.85 | 4.5 |
| $POCl_3$ | 1.48 | 0.48 |
| $GeCl_4$ | varies from 0.06 to 6.0 | varies from 0.03 to 3.0 |

As indicated by Table I only 0.03 g/m $GeCl_4$ flows into the feed tube during the first pass of the burner. The amount of $GeCl_4$ is linearly increased during the remaining forty-nine passes of the burner until 3.0 g/m $GeCl_4$ is supplied during the last pass of the burner.

After the deposition process is completed, the rate of burner movement is decreased to 2.5 cm/min and the temperature increases to about 2200° C. at the outer surface of the bait tube. This causes the collapse of the bait tube into an optical waveguide preform having a solid cross-section. The usual length of this preform is about 84 cm.

The resulting preform or blank is then heated to a temperature at which the materials thereof have a low enough viscosity for drawing (approximately 2000° C.). This structure is then drawn to form an optical waveguide filament having an outside diameter of about 110 μm.

I claim:

1. In the method of manufacturing an optical waveguide preform which includes the steps of:
   providing a first tube,
   moving a heat source relative to said first tube in a longitudinal direction, thereby forming within said first tube a moving hot zone, and
   flowing a reactant gas through said hot zone to produce a suspension of particulate material, at least a portion of which flows downstream from said hot zone where at least a portion thereof comes to rest on the inner surface of said first tube in a region of said first tube that is cooler than that portion of said tube that surrounds said hot zone, to form a deposit on said inner surface,
   the improvement which comprises:
   moving a second tube within said first tube while maintaining the end of said second tube, which is within said first tube, a fixed distance from said hot zone; and
   flowing at least a portion of said reactant gas through said second tube, radially outwardly from the end thereof, and through said hot zone.

2. The method of claim 1 further comprising the step of flowing another gas through the annular region between said first and second tubes, the combination of said first and second gases flowing through said hot zone.

3. The method of claim 1 wherein said heat source consolidates said deposited particulate material.

4. The method of claim 2 which further comprises the step of collapsing said first tube by heating said first tube after the deposition of said particulate material.

5. The method of claim 4 which further comprises the step of heating said collapsed tube to the drawing temperature of the materials thereof and drawing said tube to form a filament.

6. In the method of manufacturing an optical waveguide preform which includes the steps of:
   passing through a first tube a reactant gas which, when heated, forms particulate material; and
   moving a heat source along the outside of said first tube to form a hot zone therein whereby at least a portion of said gas is converted to particulate material and at least a portion of said particulate material flows downstream from said hot zone where at least a portion thereof is deposited on the inside of said first tube in a region of said first tube that is cooler than that portion of said first tube adjacent to said heat source,
   the improvement which comprises:
   positioning a second tube coaxially within said first tube such that a first end of said second tube is within said first tube,
   reciprocatingly moving said first end of said second tube,
   maintaining said first end of said second tube in axially spaced relation to and upstream of said heat source, and
   flowing said reactant gas radially from said first end of said second tube and through that region of said first tube adjacent to said heat source.

7. The method of claim 6 wherein said second tube and said heat source are maintained in spaced relation by mechanical coupling.

8. In a method of manufacturing an optical device, said method being of the type that includes the steps of
flowing a vapor mixture including at least one compound, glass-forming precursor, together with an oxidizing medium, through a hollow, cylindrical substrate, and
heating said substrate and contained vapor mixture with a heat source that moves relative to said substrate in a longitudinal direction, whereby a moving hot zone is established within said substrate, such that a suspension of particulate material is produced, said particulate material traveling downstream where at least a portion thereof comes to rest on the inner surface of said substrate to form an continuous glassy deposit on said inner surface,
the improvement which comprises
introducing said vapor mixture into said substrate upstream of said hot zone in such a manner that the flow of said mixture into said hot zone has a velocity component directed radially outwardly from the axis of said substrate, a velocity component directed axially through said hot zone, and an angular flow velocity component, whereby said mixture flows into said hot zone in a spiral path.

9. The method of claim 8 wherein the step of flowing said vapor mixture into said hot zone comprises introducing a tube into said substrate that is coaxial therewith, the output end of said tube terminating just short of said hot zone and moving in synchronism therewith, at least a portion of said vapor mixture emanating radially from that end of said tube adjacent said hot zone.

10. The method of claim 9 further comprising the step of flowing a stream of gas through the annular region between said tube and said substrate and into said hot zone.

11. The method according to claim 10 further comprising the step of heating said substrate to a temperature sufficiently high to close the aperture therein, thereby forming a draw blank.

12. The method of claim 11 further comprising the steps of heating said draw blank to the drawing temperature of the materials thereof and drawing said blank to form an optical waveguide filament.

13. In an apparatus for manufacturing an optical waveguide preform which apparatus includes
means for supporting a first tube,
means for heating a portion of said first tube to form a hot zone therein,
means for providing relative longitudinal movement between first tube and said heating means, and
means for introducing into said first tube a reactant gas mixture which flows through said hot zone and, when heated therein, forms particulate material, at least a portion of which flows downstream from said hot zone where at least a portion thereof comes to rest on the inner surface of said first tube in a region thereof that is cooler than that portion of said first tube that surrounds said hot zone,
said means for introducing being characterized in that it comprises
a second tube, one end of said second tube being disposed within said first tube, said one end being closed and terminating upstream of said hot zone, said second tube having orifices in the outside wall thereof at said one end,
means for moving said one end of said second tube with respect to said first tube,
means for maintaining a relatively fixed relationship between said heating means and said one end of said second tube, and
means for flowing into the remaining end of said second tube at least a portion of said reactant gas mixture.

14. The apparatus of claim 13 further comprising means for flowing into the region between said first and second tubes a gas which combines with the reactant gas mixture flowing from said orifices.

15. The apparatus of claim 13 further comprising means for providing relative rotation between said first and second tubes.

16. The apparatus of claim 13 wherein said orifices in said second tube extend non-radially through the wall of said second tube.

17. In an apparatus for manufacturing an optical waveguide preform, which apparatus includes
means for supporting a tubular substrate,
means for heating an axial section of said substrate thereby forming a hot zone within said substrate,
means for moving said heating means longitudinally with respect to said substrate, and
means for introducing into said substrate a moving stream of a vapor mixture including at least one compound glass-forming precursor together with an oxidizing medium, said vapor mixture being capable of reacting within said hot zone to form a suspension of particulate material, at least a portion of which travels downstream from said hot zone and comes to rest on the inner surface of said substrate,
the improvement comprising
means for introducing at least a portion of said vapor mixture into said hot zone in such a manner that the flow velocity thereof has a radial component, a velocity component directed axially through said hot zone, and an angular flow velocity component, whereby said mixture flows into said hot zone in a spiral path.

* * * * *

UNITED STATES PATENT AND TRADEMARK OFFICE
CERTIFICATE OF CORRECTION

PATENT NO. : 4,233,045
DATED : November 11, 1980
INVENTOR(S) : Arnab Sarkar

It is certified that error appears in the above-identified patent and that said Letters Patent are hereby corrected as shown below:

Column 1, line 25, "vapour" should be -- vapor --.

Column 3, line 20, "radical" should be -- radial --.

Column 4, line 6, "as" should be -- are --.

Column 4, line 22, "reactants" should be -- reactant --.

Column 7, line 65, "usual" should be -- usable --.

Column 8, line 18, after "said", second occurrence, insert -- first --.

Signed and Sealed this

Fourteenth Day of April 1981

[SEAL]

Attest:

RENE D. TEGTMEYER

Attesting Officer

Acting Commissioner of Patents and Trademarks